(12) United States Patent
Kando

(10) Patent No.: US 9,413,334 B2
(45) Date of Patent: Aug. 9, 2016

(54) ELASTIC WAVE DEVICE USING SH SURFACE ACOUSTIC WAVE

(71) Applicant: Murata Manufacturing Co., Ltd., Nagaokakyo-shi, Kyoto-fu (JP)

(72) Inventor: Hajime Kando, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/483,357

(22) Filed: Sep. 11, 2014

(65) Prior Publication Data

US 2015/0028720 A1 Jan. 29, 2015

Related U.S. Application Data

(63) Continuation of application No. PCT/JP2013/057488, filed on Mar. 15, 2013.

(30) Foreign Application Priority Data

Mar. 23, 2012 (JP) ................................. 2012-067621

(51) Int. Cl.
*H03H 9/25* (2006.01)
*H01L 41/08* (2006.01)
(Continued)

(52) U.S. Cl.
CPC ............... *H03H 9/25* (2013.01); *H01L 41/083* (2013.01); *H01L 41/0805* (2013.01);
(Continued)

(58) Field of Classification Search
CPC ........... H03H 9/02559; H03H 9/02574; H01L 41/0993
USPC ...................................... 310/313 R
See application file for complete search history.

(56) References Cited

U.S. PATENT DOCUMENTS 7,615,910 B1 * 11/2009 Shih .................... H03H 9/02574
310/313 A
8,490,260 B1 * 7/2013 Zhgoon .............. H03H 9/02574
29/25.35
(Continued)

FOREIGN PATENT DOCUMENTS

EP 2 773 040 A1 9/2014
JP 11-191721 A 7/1999
(Continued)

OTHER PUBLICATIONS

Official Communication issued in International Patent Application No. PCT/JP2013/057488, mailed on May 21, 2013.
(Continued)

*Primary Examiner* — J. San Martin
(74) *Attorney, Agent, or Firm* — Keating & Bennett, LLP

(57) ABSTRACT

An elastic wave device includes a lithium niobate film, a supporting substrate, a high-acoustic-velocity film located on the supporting substrate and configured so that the acoustic velocity of a propagating bulk wave is higher than the acoustic velocity of an elastic wave that propagates on the lithium niobate film, a low-acoustic-velocity film stacked on the high-acoustic-velocity film and configured so that the acoustic velocity of the propagating bulk wave is lower than the acoustic velocity of the bulk wave that propagates in the lithium niobate film, the lithium niobate film being stacked on the low-acoustic-velocity film, and an IDT electrode located on either side of the lithium niobate film. When the lithium niobate film has Euler angles of $(0°±5°, \theta, 0°)$, $\theta$ is in the range of about 0° to about 8° and about 57° to about 180°.

9 Claims, 14 Drawing Sheets

(51) Int. Cl.
  *H01L 41/083* (2006.01)
  *H01L 41/187* (2006.01)
  *H01L 41/253* (2013.01)
  *H01L 41/277* (2013.01)
  *H01L 41/29* (2013.01)
  *H01L 41/312* (2013.01)
  *H01L 41/314* (2013.01)
  *H01L 41/39* (2013.01)
  *H03H 3/10* (2006.01)
  *H03H 9/02* (2006.01)

(52) U.S. Cl.
  CPC ......... *H01L 41/1873* (2013.01); *H01L 41/253* (2013.01); *H01L 41/277* (2013.01); *H01L 41/29* (2013.01); *H01L 41/312* (2013.01); *H01L 41/314* (2013.01); *H01L 41/39* (2013.01); *H03H 3/10* (2013.01); *H03H 9/02559* (2013.01); *H03H 9/02574* (2013.01)

(56) References Cited

U.S. PATENT DOCUMENTS

| | | | |
|---|---|---|---|
| 2004/0226162 A1 | 11/2004 | Miura et al. | |
| 2006/0114081 A1* | 6/2006 | Furuhata | H03H 3/08 333/193 |
| 2007/0090898 A1* | 4/2007 | Kando | H03H 9/0222 333/195 |
| 2010/0038991 A1 | 2/2010 | Shih et al. | |
| 2010/0141088 A1* | 6/2010 | Matsuda | H03H 9/0222 310/313 R |
| 2012/0176001 A1 | 7/2012 | Kadota | |
| 2012/0194032 A1 | 8/2012 | Kadota | |
| 2013/0026881 A1* | 1/2013 | Okamoto | H03H 9/0222 310/313 C |
| 2013/0285768 A1* | 10/2013 | Watanabe | H03H 9/0222 333/193 |
| 2013/0300253 A1* | 11/2013 | Kimura | H03H 9/02818 310/313 A |
| 2015/0008789 A1* | 1/2015 | Iwamoto | H03H 3/10 310/313 R |
| 2015/0102705 A1* | 4/2015 | Iwamoto | H03H 9/0222 310/313 B |

FOREIGN PATENT DOCUMENTS

| | | | | |
|---|---|---|---|---|
| JP | 2004-282232 A | 10/2004 | | |
| JP | 2004-343359 A | 12/2004 | | |
| JP | 2005-210294 A | 8/2005 | | |
| JP | 2006-093971 A | 4/2006 | | |
| JP | 2010-045752 A | 2/2010 | | |
| JP | 2011-120062 A | 6/2011 | | |
| JP | WO 2013031651 A1 * | 3/2013 | ............... | H03H 3/08 |
| JP | WO 2015052888 A1 * | 4/2015 | ......... | H03H 9/02574 |
| JP | WO 2015080045 A1 * | 6/2015 | ............... | H04B 1/50 |
| WO | 2011/037145 A1 | 3/2011 | | |
| WO | 2011/046117 A1 | 4/2011 | | |

OTHER PUBLICATIONS

Official Communication issued in corresponding European Patent Application No. 13763886.2, mailed on Mar. 29, 2016.

* cited by examiner

ELASTIC WAVE DEVICE USING SH SURFACE ACOUSTIC WAVE

BACKGROUND OF THE INVENTION

1. Field of the Invention

The present invention relates to an elastic wave device for components such as a resonator and a band-pass filter and a method for producing an elastic wave device and, more specifically, to an elastic wave device having a structure in which other materials are provided between a lithium niobate film and a supporting substrate and a method for producing such an elastic wave device.

2. Description of the Related Art

Elastic wave devices have been used as resonators and band-pass filters. Japanese Unexamined Patent Application Publication No. 2004-282232 discloses a surface acoustic wave device having a hard dielectric layer, a piezoelectric film, and an IDT electrode stacked on a dielectric substrate in this order. This surface acoustic wave device, in which a hard dielectric layer is disposed between a dielectric substrate and a piezoelectric film, offers an increased acoustic velocity of the surface acoustic wave. This allows the frequency of the surface acoustic wave device to be increased.

The surface acoustic wave device described in Japanese Unexamined Patent Application Publication No. 2004-282232 offers an increased acoustic velocity obtained through the formation of a hard dielectric layer. This means that a high-acoustic-velocity hard dielectric layer is disposed on the bottom of a piezoelectric film. This causes the elastic wave to propagate concentrating in the piezoelectric film. As a result, wave modes other than the surface acoustic wave to be used often occur, including 1) higher-order modes of that surface acoustic wave, 2) an elastic wave that propagates reflecting off of the surface of the piezoelectric film and the boundary between the piezoelectric film and the hard dielectric layer like a plate wave, and 3) higher-order modes of this elastic wave. It has therefore been a disadvantage that large spurious responses appear in addition to the mode of surface acoustic wave to be used.

SUMMARY OF THE INVENTION

Preferred embodiments of the present invention provide an elastic wave device that not only offers an increased acoustic velocity but also is insusceptible to the spurious responses of other wave modes and a method for producing such an elastic wave device.

An elastic wave device according to a preferred embodiment of the present invention includes a lithium niobate film and uses an SH surface acoustic wave. More specifically, an elastic wave device according to a preferred embodiment of the present invention includes a supporting substrate, a high-acoustic-velocity film, a low-acoustic-velocity film, and a lithium niobate film. The high-acoustic-velocity film, located on the supporting substrate, is a film in which the acoustic velocity of the propagating bulk wave is higher than the acoustic velocity of the elastic wave that propagates on the lithium niobate film. The low-acoustic-velocity film is stacked on the high-acoustic-velocity film. The low-acoustic-velocity film is a film in which the acoustic velocity of the propagating bulk wave is lower than the acoustic velocity of the bulk wave that propagates in the lithium niobate film. A lithium niobate film is stacked on the low-acoustic-velocity film. In a preferred embodiment of the present invention, an IDT electrode is provided on either side of the lithium niobate film, and when the lithium niobate film has Euler angles of (0°±5°, θ, 0°), θ is preferably in the range of about 0° to about 8° and about 57° to about 180°, for example.

Preferably, the Euler angle θ is in the range of about 83° to about 145° or about 100° to about 160°, for example. The electromechanical coupling coefficient $k^2$ of the SH surface acoustic wave can be as high as about 20% or more when θ is in the range of about 83° to about 145°, for example. The electromechanical coupling coefficient $k^2$ of the spurious Rayleigh wave can be very low, as low as about 1% or less, when θ is in the range of about 100° to about 160°, for example.

In another certain aspect of an elastic wave device according to a preferred embodiment of the present invention, the low-acoustic-velocity film is preferably made of silicon oxide. The absolute temperature coefficient of frequency is reduced in this case.

In another certain aspect of an elastic wave device according to a preferred embodiment of the present invention, (x, y) in xy coordinates preferably is in the area defined by connecting the points (0.023λ, 0.3λ), (0.05λ, 0.20λ), (0.10λ, 0.14λ), (0.20λ, 0.125λ), (0.44λ, 0.14λ), (0.47λ, 0.20λ), (0.435λ, 0.25λ), (0.3λ, 0.36λ), (0.15λ, 0.42λ), (0.08λ, 0.42λ), (0.05λ, 0.40λ), and (0.23λ, 0.3λ) in this order, where x is the film thickness of silicon oxide, y is the thickness of the lithium niobate film, and λ is the wavelength of the fundamental mode of the SH surface acoustic wave. The electromechanical coupling coefficient $k^2$ of the SH surface acoustic wave can be as high as about 26% or more, for example, in this case.

In another certain aspect of an elastic wave device according to a preferred embodiment of the present invention, the high-acoustic-velocity film preferably is a film made of a material selected from the group consisting of aluminum nitride, silicon nitride, and aluminum oxide or a multilayer film made of these materials. The acoustic velocity of the SH surface acoustic wave is increased in this case. More preferably, the high-acoustic-velocity film preferably has a thickness of about 0.3λ to about 1λ, where λ is the wavelength of the fundamental mode of the SH surface acoustic wave. In this case, the propagation loss on the anti-resonant frequency side can be as small as about 0.01 Np/λ or less, for example, and the spurious responses of higher-order wave modes can be more effectively suppressed than in other cases.

In another certain aspect of an elastic wave device according to a preferred embodiment of the present invention, the IDT electrode is preferably made of Au, and the IDT electrode made of Au preferably has a thickness of about 0.01λ to about 0.03λ, where λ is the wavelength of the fundamental mode of the SH surface acoustic wave. In this case, the electromechanical coupling coefficient $k^2$ thereof is higher, and the electromechanical coupling coefficient $k^2$ of the spurious Rayleigh wave is even lower than in other cases.

In another certain aspect of an elastic wave device according to a preferred embodiment of the present invention, the supporting substrate preferably has a coefficient of linear expansion smaller than the coefficient of linear expansion of the lithium niobate film. The temperature characteristics is further improved in this case.

In another aspect of an elastic wave device according to a preferred embodiment of the present invention, the low-acoustic-velocity film has a specific acoustic impedance smaller than the specific acoustic impedance of the lithium niobate film. The band width ratio is further increased in this case.

A method according to a preferred embodiment of the present invention for producing an elastic wave device includes providing a supporting substrate, forming a high-acoustic-velocity film on the supporting substrate, the highacoustic-velocity film configured so that the acoustic velocity of the propagating bulk wave is higher than the acoustic velocity of the elastic wave that propagates on lithium niobate, forming a low-acoustic-velocity film on the high-acoustic-velocity film, the low-acoustic-velocity film configured so that the acoustic velocity of the propagating bulk wave is lower than the acoustic velocity of the bulk wave that propagates in lithium niobate, forming a lithium niobate film on the low-acoustic-velocity film, the lithium niobate film configured so that the θ of Euler angles (0°±5°, θ, 0°) is in the range of about 0° to about 8° or about 57° to about 180°, and forming an IDT electrode on either side of the lithium niobate film.

In a certain aspect of a method according to a preferred embodiment of the present invention for producing an elastic wave device, the steps of forming the high-acoustic-velocity film, the low-acoustic-velocity film, and the lithium niobate film on the supporting substrate preferably include the following (a) to (e).

(a) Implanting an ion in either side of a lithium niobate substrate thicker than the lithium niobate film.

(b) Forming a low-acoustic-velocity film on the side of the lithium niobate substrate where the ion is implanted.

(c) Forming a high-acoustic-velocity film on the side of the low-acoustic-velocity film opposite the lithium niobate substrate.

(d) Joining a supporting substrate to the side of the high-acoustic-velocity film opposite the side where the low-acoustic-velocity film is stacked.

(e) Separating a lithium niobate film and the remaining lithium niobate substrate portion at a high-dose ion-implanted portion, where the implanted ion has the highest concentration in the lithium niobate substrate, while heating the lithium niobate substrate to leave the lithium niobate film on the low-acoustic-velocity film side.

Another certain aspect of a method according to a preferred embodiment of the present invention for producing an elastic wave device further includes, after removing the remaining lithium niobate substrate portion, heating the lithium niobate film stacked on the low-acoustic-velocity film to recover piezoelectricity. In this case, the piezoelectricity of the lithium niobate film is recovered through heating, which makes more certain that an elastic wave device having good resonance characteristics and filter characteristics will be provided.

Another certain aspect of a method according to a preferred embodiment of the present invention for producing an elastic wave device further includes, before joining the supporting substrate, mirror-finishing the side of the high-acoustic-velocity film opposite the low-acoustic-velocity film. The strength of the joint between the high-acoustic-velocity film and the supporting substrate is enhanced in this case.

In an elastic wave device according to a preferred embodiment of the present invention, a high-acoustic-velocity film and a low-acoustic-velocity film stacked between a supporting substrate and a lithium niobate film make the acoustic velocity of the SH surface acoustic wave sufficiently separate from the acoustic velocity of the spurious Rayleigh wave. Furthermore, an Euler angle of the lithium niobate film being in the particular range defined above, which allows the electromechanical coupling coefficient $K^2$ of the SH surface acoustic wave to be used to be high as compared with the electromechanical coupling coefficient $K^2$ of the spurious Rayleigh wave.

As a result, an elastic wave device insusceptible to spurious responses is provided.

A method according to a preferred embodiment of the present invention for producing an elastic wave device allows an elastic wave device to be provided that uses an SH surface acoustic wave and is insusceptible to the spurious response of the Rayleigh wave.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The following describes some specific preferred embodiments of the present invention with reference to the drawings to make the invention more clearly understood.

Figure 1A:
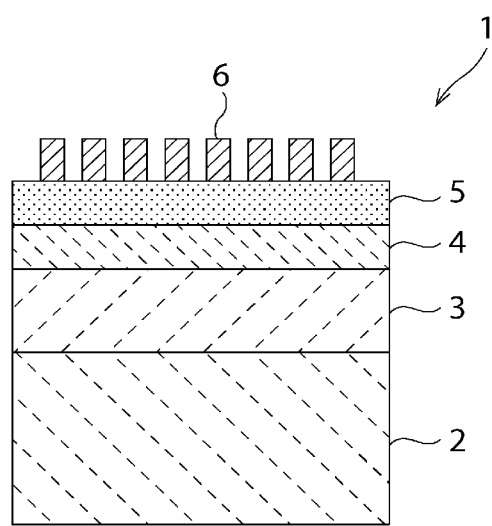
FIG. 1A and FIG. 1B are a schematic elevational cross-sectional view of an elastic wave device according to Preferred Embodiment 1 of the present invention and a schematic plan view of its electrode structure, respectively.

FIG. 1A is a schematic elevational cross-sectional view of a surface acoustic wave according to Preferred Embodiment 1 of the present invention.

The surface acoustic wave device 1 includes a supporting substrate 2. A high-acoustic-velocity film 3, in which the acoustic velocity is relatively high, is stacked on the supporting substrate 2. A low-acoustic-velocity film 4, in which the acoustic velocity is relatively low, is stacked on the high-acoustic-velocity film 3. A lithium niobate film 5 is stacked on the low-acoustic-velocity film 4. An IDT electrode 6 is stacked on the top of this lithium niobate film 5. The IDT electrode 6 may be stacked on the bottom of the lithium niobate film 5 instead.

The supporting substrate 2 can be made of any appropriate material as long as it can support the multilayer structure including the high-acoustic-velocity film 3, the low-acoustic-velocity film 4, the lithium niobate film 5, and the IDT electrode 6. Examples of such materials that can be used include piezoelectrics, dielectrics, and semiconductors. In this preferred embodiment, the supporting substrate 2 preferably is made of alumina.

The high-acoustic-velocity film 3 is configured to confine the surface acoustic wave to the portion where the lithium niobate film 5 and the low-acoustic-velocity film 4 are stacked. In this preferred embodiment, the high-acoustic-velocity film 3 preferably is made of aluminum nitride. However, various high-acoustic-velocity materials can be used as long as they confine the elastic wave, including aluminum nitride, aluminum oxide, silicon carbide, silicon nitride, and diamond.

In order to confine the elastic wave to the portion where the lithium niobate film 5 and the low-acoustic-velocity film 4 are stacked, it is desirable that the high-acoustic-velocity film 3 have a thickness of about 0.5 times or more, more desirably about 1.5 times or more, of the wavelength λ of the elastic wave, for example.

As mentioned herein, a high-acoustic-velocity film refers to a film in which the acoustic velocity of the slow transversal wave in the high-acoustic-velocity film is higher than the acoustic velocity of the elastic wave that propagates on the lithium niobate film 5. A low-acoustic-velocity film refers to a film in which the acoustic velocity of the slow transversal wave in the low-acoustic-velocity film is lower than the acoustic velocity of the slow transversal wave that propagates in the lithium niobate film 5. The acoustic velocity in these definitions is the acoustic velocity in the direction of the propagation of the elastic wave. The mode of a bulk wave that propagates in a medium, which determines the acoustic velocity of the bulk wave, is defined according to the mode in use of the elastic wave that propagates on the lithium niobate film 5. When the high-acoustic-velocity film 3 and the low-acoustic-velocity film 4 are isotropic with respect to the direction of the propagation of the bulk wave, the mode of the bulk wave is as summarized in Table 1 below. In other words, for the main modes of elastic waves on the left side in Table 1 below, the high acoustic velocity and the low acoustic velocity are determined according to the modes of bulk waves on the right side in Table 1 below. The P wave is a longitudinal wave, and the S wave is a transversal wave.

In Table 1 below, U1 represents an elastic wave whose main component is the P wave, U2 an elastic wave whose main component is the SH wave, and U3 an elastic wave whose main component is the SV wave.

TABLE 1

Correspondence between modes of elastic waves in a piezoelectric film and modes of bulk waves in a dielectric film (for a dielectric film made of an isotropic material)

| Main mode of the elastic wave that propagates on the piezoelectric film | Mode of the bulk wave that propagates in the dielectric film |
|---|---|
| U1 | P wave |
| U2 | S wave |
| U3 + U1 | S wave |

When the low-acoustic-velocity film 4 and the high-acoustic-velocity film 3 are anisotropic in terms of the propagation of the bulk wave, the mode of the bulk wave, which determines the high acoustic velocity and the low acoustic velocity, is determined as summarized in Table 2 below. The slower of the SH and SV modes of bulk waves is referred to as the slow transversal wave, and the faster is referred to as the fast transversal wave. Which is the slow transversal wave depends on the anisotropy of the material. In LiTaO$_3$ or lithium niobate near a rotated Y-cut, the SV bulk wave is the slow transversal wave, and the SH bulk wave is the fast transversal wave.

TABLE 2

Correspondence between modes of elastic waves in a piezoelectric film and modes of bulk waves in a dielectric film (for a dielectric film made of an anisotropic material)

| Main mode of the elastic wave that propagates on the piezoelectric film | Mode of the bulk wave that propagates in the dielectric film |
|---|---|
| U1 | P wave |
| U2 | SH wave |
| U3 + U1 | SV wave |

A surface acoustic wave device 1 according to this preferred embodiment uses an SH surface acoustic wave that propagates on lithium niobate. This means that other waves such as the Rayleigh wave can cause spurious responses. In this preferred embodiment, as described below, the low-acoustic-velocity film 4 and the high-acoustic-velocity film 3 are stacked, and θ of the Euler angles (0°±5°, θ, 0°) of the lithium niobate film 5 is in a particular range. As a result, the device is insusceptible to the spurious response of the Rayleigh wave.

In various preferred embodiments of the present invention, the low-acoustic-velocity film 4 and the high-acoustic-velocity film 3 preferably are made of appropriate dielectrics that achieve a low acoustic velocity and a high acoustic velocity that are determined in the way described above. Examples of materials that can be used for the low-acoustic-velocity film 4 include dielectrics with an acoustic velocity of a bulk wave lower than the acoustic velocity of the bulk wave that propagates in the lithium niobate film 5. Examples of such dielectrics that can be used include silicon oxide, glass, silicon oxide nitride, tantalum oxide, and compounds including silicon oxide and an additional element such as fluorine, carbon, or boron. In particular, the use of silicon oxide as the low-acoustic-velocity film 4 allows the absolute temperature coefficient of resonant frequency to be reduced, thus allowing the temperature characteristics to be improved.

The lithium niobate film 5, having Euler angles of (0°±5°, θ, 0°), preferably has θ of about 0° to about 8° or about 57° to about 180°, for example.

The IDT electrode 6 preferably is made of Al in this preferred embodiment. However, the IDT electrode 6 can be made of any appropriate metallic material, such as Al, Cu, Pt, Au, Ag, Ti, Ni, Cr, Mo, W, or an alloy based on any of these metals. The IDT electrode 6 may also have a multilayer structure including multiple metal films made of these materials or alloys.

Figure 1B:
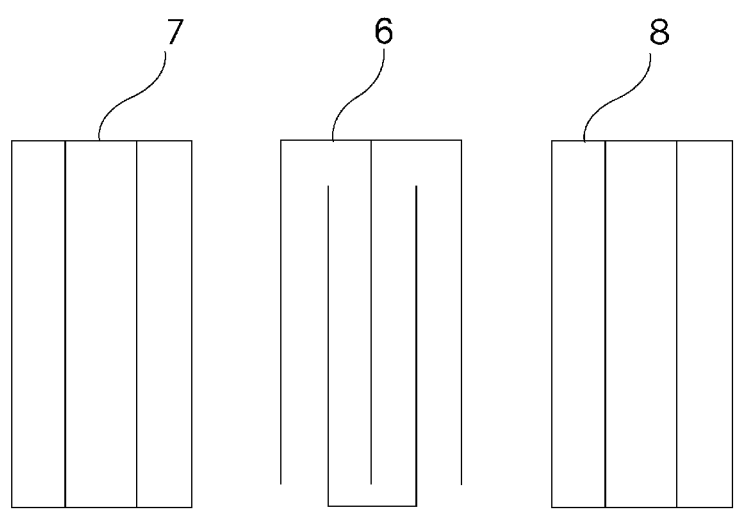

Although schematically illustrated in FIG. 1A, an electrode structure illustrated in FIG. 1B is provided on the lithium niobate film 5. More specifically, the IDT electrode 6 and reflectors 7 and 8 are provided with the reflectors arranged on the both sides of the IDT electrode 6 in the direction of the propagation of the surface acoustic wave, making up a one-port surface acoustic wave resonator. However, an electrode structure including the IDT electrode according to various preferred embodiments of the present invention can be in any form. It can be modified to make up any appropriate resonator, a filter as a combination of resonators such as a ladder filter, a longitudinally coupled filter, a lattice filter, or a transversal filter, and so forth.

A surface acoustic wave device 1 according to this preferred embodiment therefore preferably includes a high-acoustic-velocity film 3 and a low-acoustic-velocity film 4 stacked between a lithium niobate film 5 and a supporting substrate 2 and the Euler angle θ of the lithium niobate film 5 that is in the particular range defined above. As a result, the device is insusceptible to the spurious response of the Rayleigh wave. This is described below.

Figure 2:
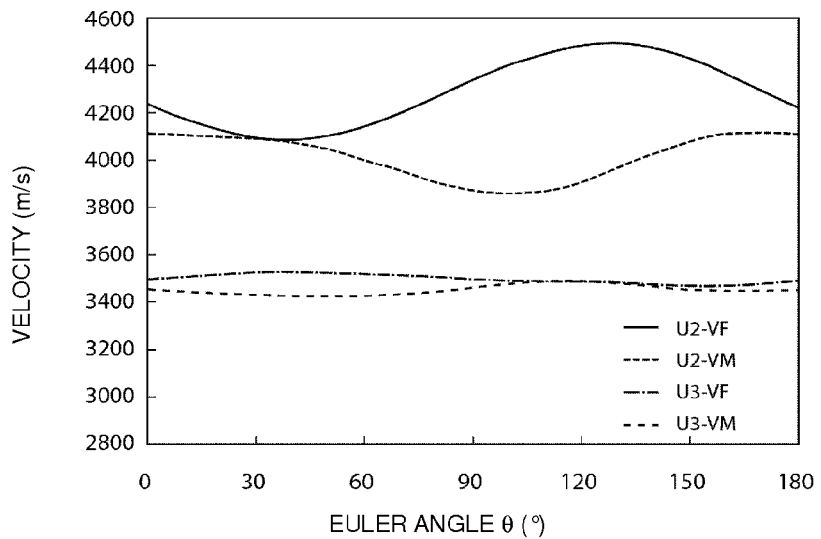
FIG. 2 is a diagram that illustrates the relationship of the Euler angle θ of lithium niobate in a structure including a silicon nitride film, a silicon oxide film, and a lithium niobate film located on a supporting substrate made of alumina and an Al electrode located thereon with the acoustic velocity of wave modes U2-VF, U2-VM, U3-VF, and U3-VM.
Figure 3:
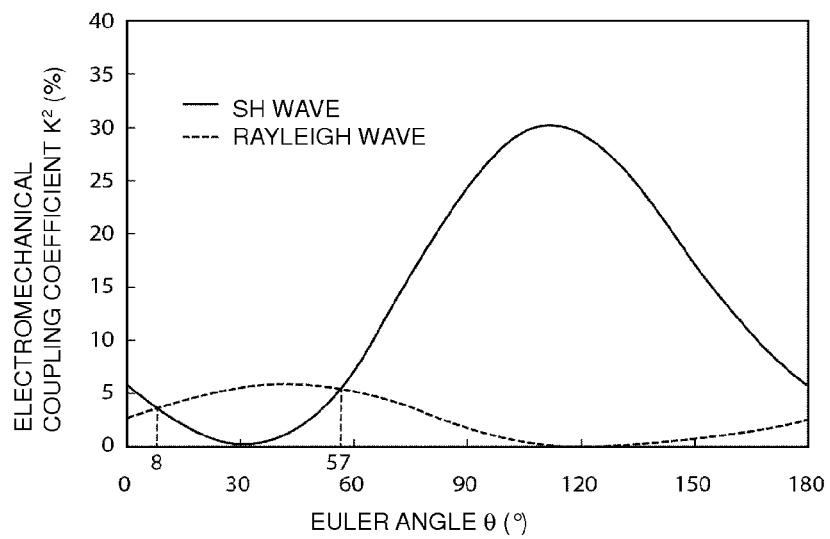
FIG. 3 is a diagram that illustrates the relationship of the Euler angle θ in a structure including an aluminum nitride film, a silicon oxide film, a lithium niobate film, and an IDT electrode made of Al located on an aluminum substrate with the electromechanical coupling coefficient $K^2$ of the SH wave and the Rayleigh wave.
Figure 4:
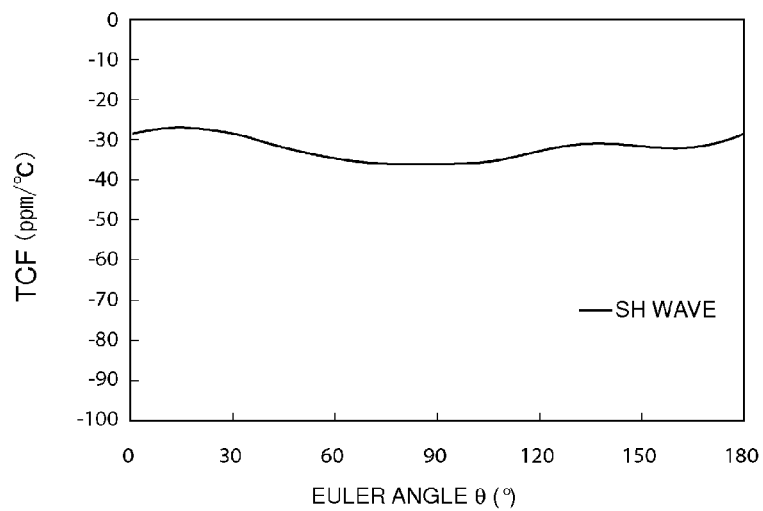
FIG. 4 is a diagram that illustrates the relationship between the Euler angle θ in a structure including an aluminum nitride film, a silicon oxide film, a lithium niobate film, and an IDT electrode made of Al located on an alumina substrate and the TCV of the SH wave.

FIG. 2 to FIG. 4 are diagrams that illustrate changes in the acoustic velocity, electromechanical coupling coefficient $k^2$, and temperature coefficient of resonant frequency TCV of examples of a surface acoustic wave device 1 according to the above preferred embodiment versus the Euler angle θ. A supporting substrate 2 made of aluminum was used as the supporting substrate. Aluminum nitride was used as the high-acoustic-velocity film 3. A silicon oxide film was used as the low-acoustic-velocity film 4. The thickness of the silicon-oxide low-acoustic-velocity film 4 was 0.20λ, where λ is a wavelength determined by the period of the fingers of the IDT electrode. The thickness of the lithium niobate film 5 was 0.20λ, and the IDT electrode was formed from Al having a thickness of 0.08λ.

In FIG. 2, U2-VF and U2-VM represent the acoustic velocity of U2, i.e., an SH surface acoustic wave, in the open and metallized states, respectively, and U3-VF and U3-VM represent the acoustic velocity of a spurious Rayleigh wave in the open and metallized states, respectively. As is clear from FIG. 2, the acoustic velocity of the SH surface acoustic wave is significantly separate from the acoustic velocity of the Rayleigh wave over the entire range of Euler angles θ from 0° to 180°, causing the frequency point where the response of the spurious Rayleigh wave to be spaced away from the frequency point of the response of the SH wave. This makes the device insusceptible to the spurious response of the Rayleigh wave.

As is clear from FIG. 3, furthermore, the electromechanical coupling coefficient $K^2$ of the SH wave is higher than the electromechanical coupling coefficient $K^2$ of the Rayleigh wave when the Euler angle θ is in the range of about 0° to about 8° or about 57° to about 180°. Thus, in various preferred embodiments of the present invention, the Euler angle θ of the lithium niobate film preferably is, as described above, in the range of about 0° to about 8° or about 57° to about 180°, for example, so that the device can be more insusceptible to the spurious response of the Rayleigh wave.

Preferably, the Euler angle θ preferably is in the range of about 83° to about 145°, for example. The electromechanical coupling coefficient $K^2$ of the SH surface acoustic wave can be as high as about 20% or more in this case. Furthermore, the Euler angle θ is preferably in the range of about 100° to about 160°, for example. The electromechanical coupling coefficient $K^2$ of the Rayleigh wave can be as low as about 1% or less in this case. More preferably, therefore, it is ensured that the electromechanical coupling coefficient $K^2$ of the SH surface acoustic is about 20% or more and at the same time reduces the electromechanical coupling coefficient $K^2$ of the Rayleigh wave is as small as about 1% or less by making the Euler angle θ in the range of about 100° to about 145°, for example.

As is clear from FIG. 4, the temperature coefficient of resonant frequency TCV of the SH wave remains almost unchanged even if the Euler angle θ changes. This means that with a lithium niobate film having an Euler angle that falls within the particular range defined above, any change in the Euler angle θ within this range is unlikely to cause much change in temperature characteristics.

Figure 5:
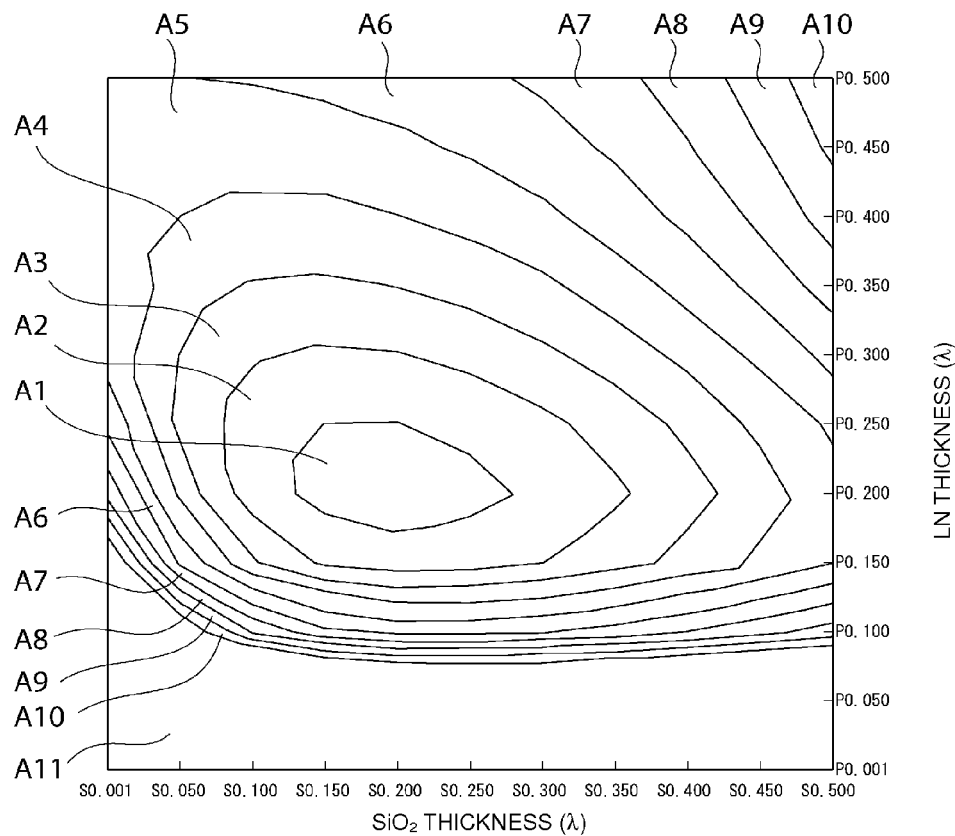
FIG. 5 is a diagram that illustrates the relationship of the thickness x of the silicon oxide film and the thickness y of the lithium niobate film with the electromechanical coupling coefficient $K^2$ in the elastic wave device illustrated in FIG. 1.

Many examples of elastic wave devices were prepared based on the surface acoustic wave device 1 described above using lithium niobate films and silicon oxide films having widely different thickness parameters. The electromechanical coupling coefficient of these elastic wave devices was measured. The results are illustrated in FIG. 5. In the diagram, the thickness of the lithium niobate film and the thickness of the silicon oxide film are values normalized for the wavelength λ of the fundamental mode of the SH surface acoustic wave.

In areas A1 to A11 in FIG. 5, the electromechanical coupling coefficient is in the ranges listed in Table 3 below.

TABLE 3

| | Electromechanical coupling coefficient $k^2$ (%) |
|---|---|
| A1 | 29 or more and less than 30 |
| A2 | 28 or more and less than 29 |
| A3 | 27 or more and less than 28 |
| A4 | 26 or more and less than 27 |
| A5 | 25 or more and less than 26 |
| A6 | 24 or more and less than 25 |
| A7 | 23 or more and less than 24 |
| A8 | 22 or more and less than 23 |
| A9 | 21 or more and less than 22 |
| A10 | 20 or more and less than 21 |
| A11 | 1 or more and less than 20 |

It is preferred that the combination of the thickness of the lithium niobate film and the thickness of the silicon oxide film be in areas A1 to A4 in FIG. 5. The electromechanical coupling coefficient $k^2$ is about 26% or more in this case, which allows a resonator or filter having a broader band width to be built.

The areas indicated with A1 to A4 in FIG. 5 can be rephrased into the area defined by connecting the following points in the xy coordinates in FIG. 5, where x is the thickness of the silicon oxide film and y is the thickness of the lithium niobate film:
(0.023λ, 0.3λ), (0.05λ, 0.20λ), (0.10λ, 0.14λ), (0.20λ, 0.125λ), (0.44λ, 0.14λ), (0.47λ, 0.20λ), (0.435λ, 0.25λ), (0.3λ, 0.36λ), (0.15λ, 0.42λ), (0.08λ, 0.42λ), (0.05λ, 0.40λ), and (0.23λ, 0.3λ).

More preferably, making the combination of x and y in the area surrounded by (0.13λ, 0.20λ)-(0.20λ, 0.175λ)-(0.275λ, 0.20λ)-(0.20λ, 0.25λ)-(0.15λ, 0.25λ)-(0.13λ, 0.225λ)-(0.13λ, 0.20λ), i.e., in area A1, ensures that the electromechanical coupling coefficient $k^2$ is about 29% or more, which allows a resonator or filter having a broader band width to be built.

Figure 6A:
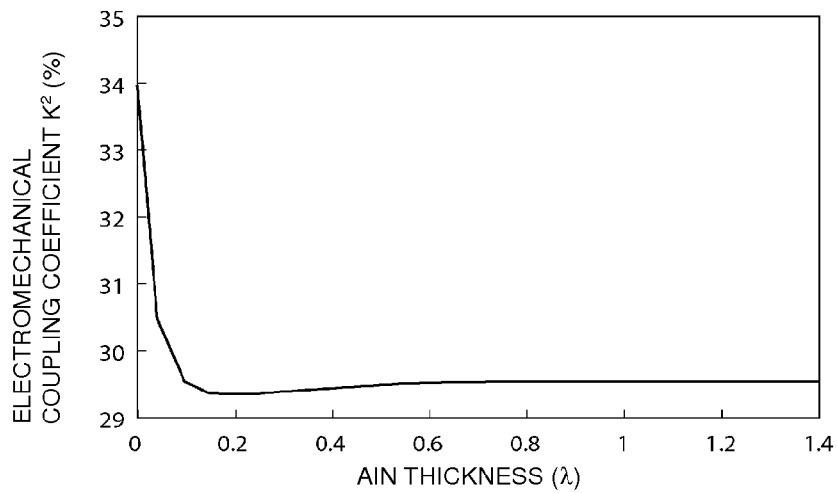
FIG. 6A to FIG. 6C are diagrams that illustrate the relationship of the thickness of an aluminum nitride film in an elastic wave device including a silicon oxide film and an aluminum nitride film located on a glass substrate, a silicon oxide film and a lithium niobate film having Euler angles of (0°, 120°, 0°) located thereon, and an IDT electrode made of Al located thereon with the electromechanical coupling coefficient $k^2$ (%), TCV (ppm/° C.), and acoustic velocity V (m/s), respectively.
Figure 6B:
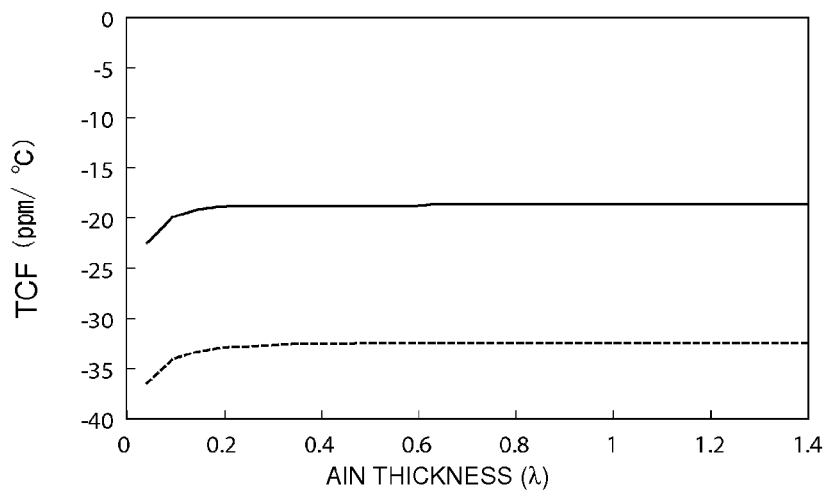
Figure 6C:
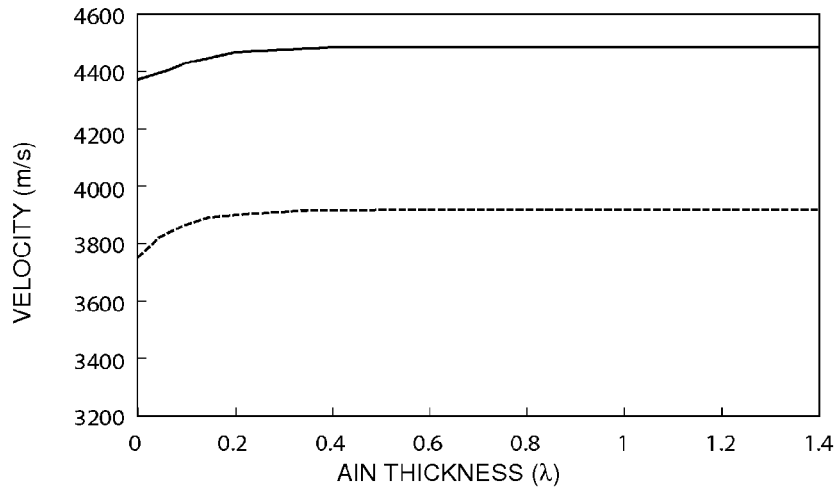

An example of an SH surface acoustic wave device described below was then prepared. A silicon oxide film having a thickness of 2λ, an aluminum nitride film as a high-acoustic-velocity film, and a 0.2λ silicon oxide film, i.e., a low-acoustic-velocity film, were formed in this order on a supporting substrate made of glass, and a 0.2λ-thick lithium niobate film having Euler angles of (0°, 120°, 0°) was formed thereon. A 0.08λ-thick electrode made of Al was then formed on the top. FIGS. 6A to 6C illustrate the propagation characteristics of the SH surface acoustic wave in this surface acoustic wave device. That is, the dependence of the electromechanical coupling coefficient $k^2$, TCV, and the acoustic velocity of the elastic wave on the thickness of the aluminum nitride film was examined using aluminum nitride films having different thickness parameters.

The acoustic velocity of a transversal wave that propagates in aluminum nitride is faster than the acoustic velocity of transversal waves that propagate in Al, lithium niobate, and silicon oxide. The vibration energy of the SH surface acoustic wave is therefore confined to the portion extending to the surface of the aluminum nitride film. Increasing the thickness of the aluminum nitride film reduces the radiation and absorption of the vibration energy of the SH surface acoustic wave into the supporting substrate, which allows the propagation loss to be reduced.

However, a thick aluminum nitride film requires a long time to form, which affects the production efficiency.

Figure 7:
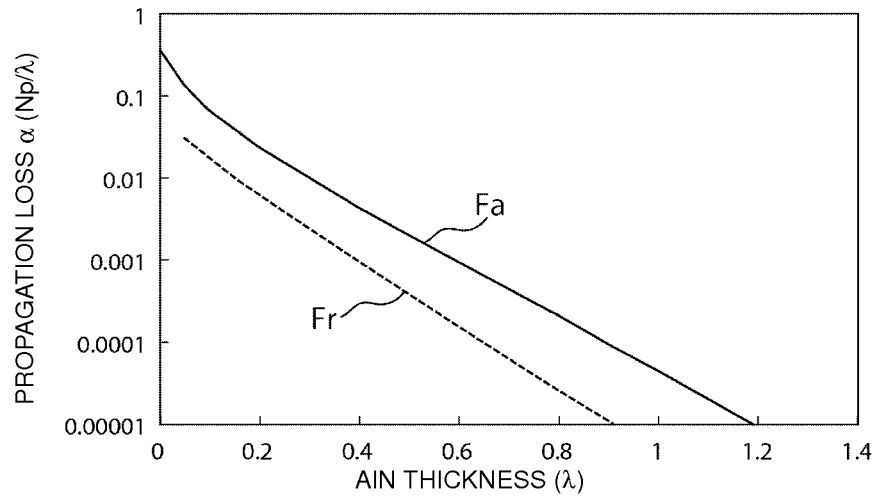
FIG. 7 is a diagram that illustrates the relationship of the thickness of an aluminum nitride film in an elastic wave device including a silicon oxide film and an aluminum nitride film located on a glass substrate, a silicon oxide film and a lithium niobate film having Euler angles of (0°, 120°, 0°) located thereon, and an IDT electrode made of Al located thereon with the propagation loss α (Np/λ).

FIG. 7 illustrates the relationship between the thickness of the aluminum nitride film and the propagation loss in the surface acoustic wave device described above. The solid line represents the propagation loss at the anti-resonant frequency, and the broken line the propagation loss at the resonant frequency. In FIG. 7, the propagation loss at the anti-resonant frequency is as small as about 0.01 Np/λ when the thickness of the aluminum nitride film is about 0.3λ or more, for example. When the thickness of the aluminum nitride film is about 0.6λ or more, the propagation loss α becomes smaller, about 0.001 Np/λ, for example. When the thickness is about 0.9λ or more, the propagation loss becomes even smaller, about 0.0001 Np/λ, for example. It is thus possible to increase the Q value of a resonator and enhance the steepness of the filter characteristics of a filter.

Although FIGS. 6A-6C and FIG. 7 illustrate a case where an aluminum nitride film was preferably used, similar results are obtained using silicon nitride (SiN) as the high-acoustic-velocity film. Similar trends are observed using $Al_2O_3$, i.e., alumina, as the high-acoustic-velocity film. With alumina, however, the propagation loss is small with a smaller thickness than with aluminum nitride.

Figure 8:
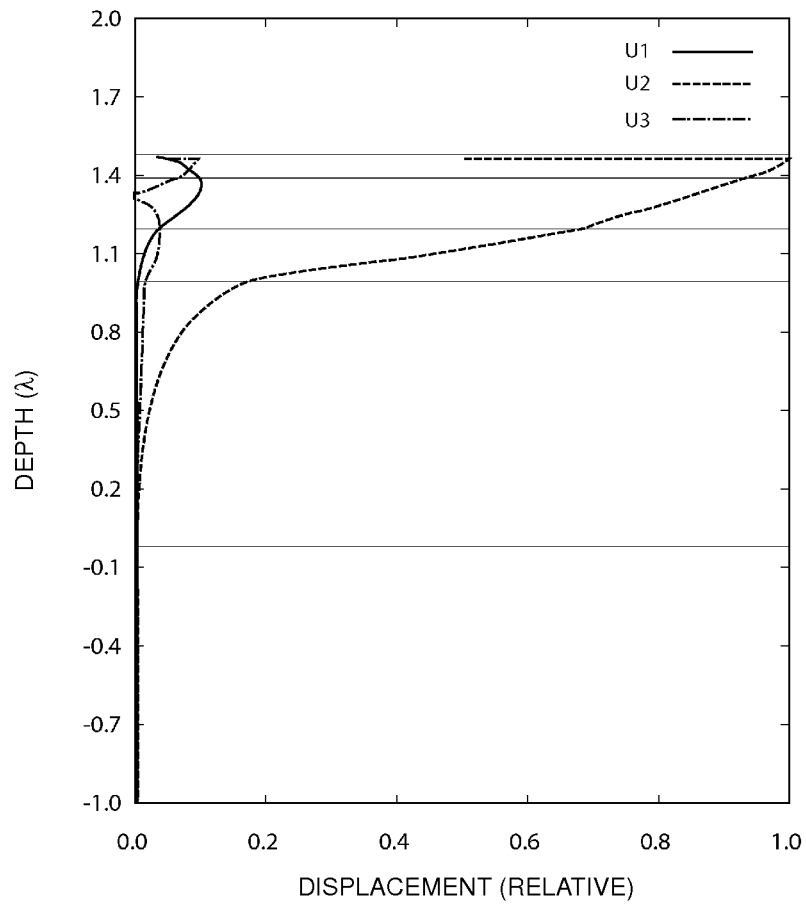
FIG. 8 is a diagram that illustrates the distribution of the energy displacement of the individual vibrating components of the fundamental mode of the SH surface acoustic wave along the direction of the thickness of the elastic wave device.
Figure 9:
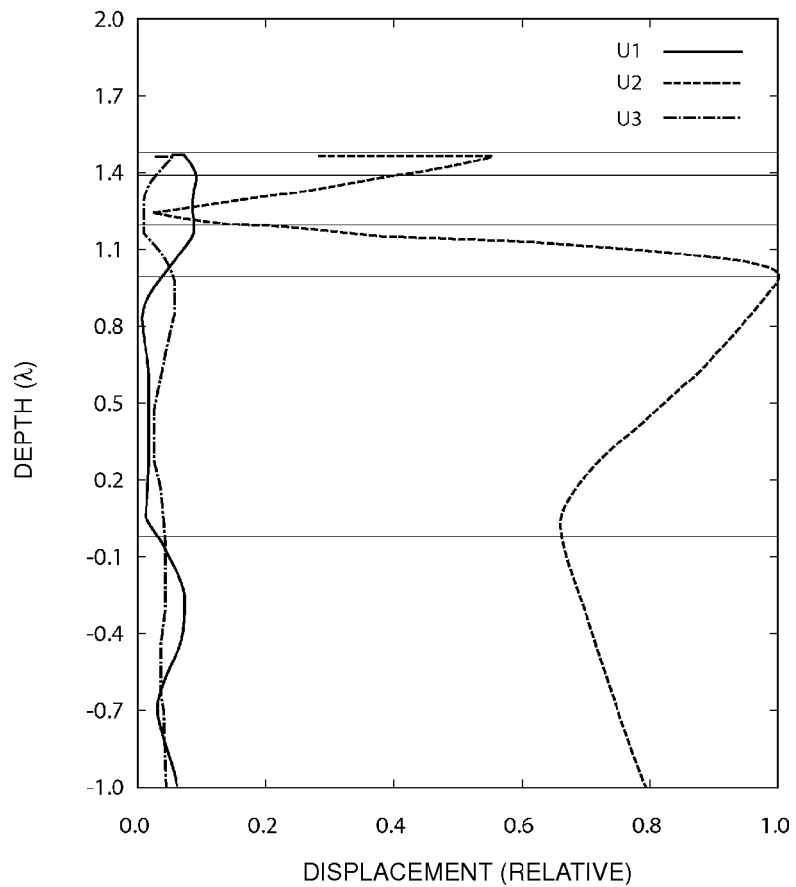
FIG. 9 is a diagram that illustrates the distribution of the energy displacement of the individual vibrating components of a higher-order mode of the SH surface acoustic wave along the direction of the thickness of the elastic wave device.

FIG. 8 illustrates the distribution of the displacement of the vibration energy of the individual vibrating components of the fundamental mode of the SH surface acoustic wave in the elastic wave device described above with an aluminum nitride film having a thickness of 1λ, and FIG. 9 is a diagram that illustrates the distribution of the displacement of the vibration energy of the vibrating components of a spurious higher-order mode of the SH surface acoustic wave. By comparing FIG. 8 and FIG. 9, it can be seen that reducing the thickness of the aluminum nitride film to 1λ or less makes the fundamental mode of the SH surface acoustic wave enclosed and allows the higher-mode to leak out. It is thus preferred that the thickness of the high-acoustic-velocity film be 1λ or less.

In light of these results in FIGS. 6A-6C and FIG. 7, furthermore, it is desirable for reduced propagation loss that the thickness of the high-acoustic-velocity film be about 0.3λ or more, more preferably about 0.6λ or more, even more preferably about 0.9λ or more, for example. A preferred range of the thickness of the high-acoustic-velocity film is therefore about 0.3λ to about 1λ, more preferably about 0.6λ to about 1λ, even more preferably about 0.9λ to about 1λ, for example.

Figure 10:
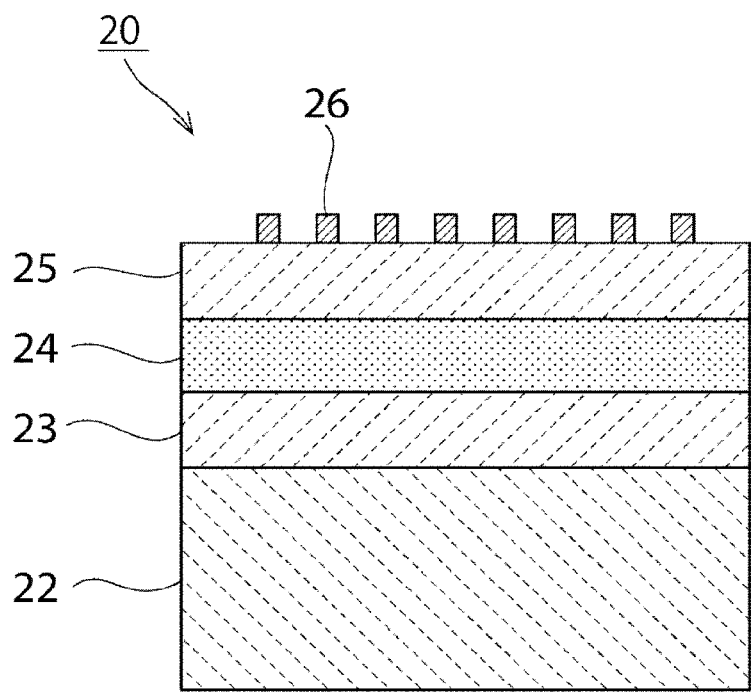
FIG. 10 is an elevational cross-sectional view of an elastic wave device according to Preferred Embodiment 2 including an aluminum nitride film, a silicon oxide film, and a lithium niobate film stacked on a glass substrate and an IDT electrode made of Au additionally provided.

As illustrated in FIG. 10, a 1.5λ-thick aluminum nitride film 23 as a high-acoustic-velocity film and a 0.2λ-thick silicon oxide film 24 as a low-acoustic-velocity film were formed on a supporting substrate 22 made of glass. A 0.2λ-thick lithium niobate film 25 was formed thereon, and an IDT electrode 26 made of Au was formed on the lithium niobate film 25.

Figure 11:
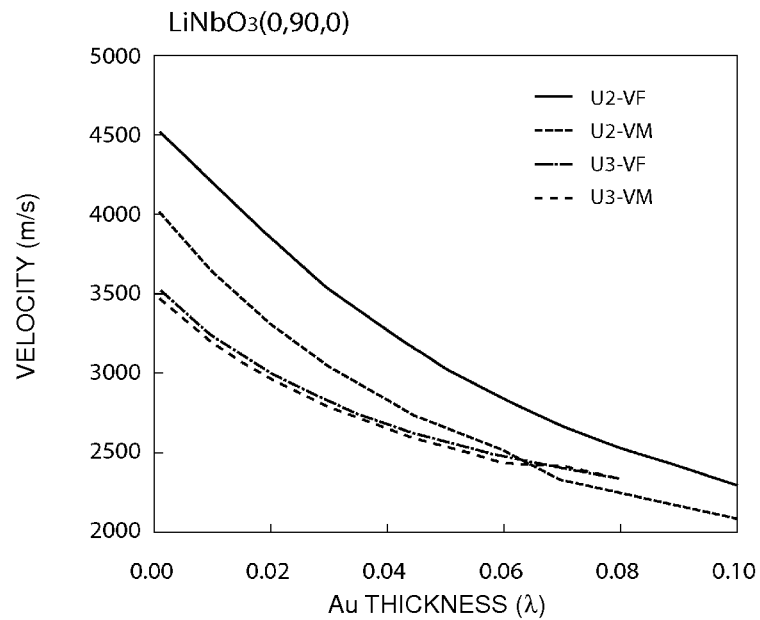
FIG. 11 is a diagram that illustrates the relationship between the thickness of the Au electrode and the acoustic velocity V of the individual wave modes with lithium niobate having Euler angles of (0°, 90°, 0°).
Figure 12:
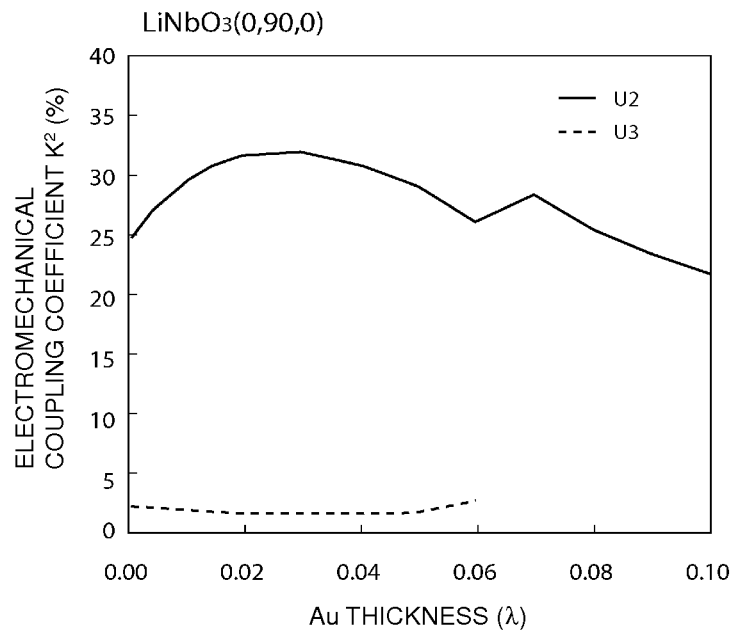
FIG. 12 is a diagram that illustrates the relationship between the thickness of the Au electrode and the electromechanical coupling coefficient $k^2$ of the individual wave modes with lithium niobate having Euler angles of (0°, 90°, 0°).

Examples of surface acoustic wave devices 20 were built using lithium niobate films 25 having different Euler angles θ, 90°, 105°, or 120°, and IDT electrodes made of Au having different thickness parameters within the range of about 0.002λ to about 0.10λ. The propagation characteristics of the SH surface acoustic wave in these surface acoustic wave devices 20 are illustrated in FIG. 11 to FIG. 16. FIG. 11 and FIG. 12 are diagrams that illustrate the relationship between the thickness of the IDT electrode made of Au and the velocity and electromechanical coupling coefficient, respectively, of the SH surface acoustic wave as measured using lithium niobate having Euler angles of (0°, 90°, 0°).

Figure 13:
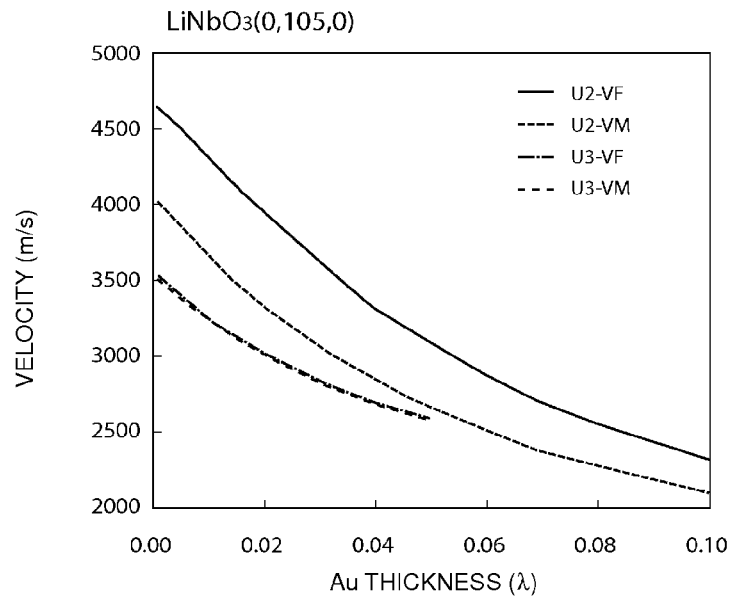
FIG. 13 is a diagram that illustrates the relationship between the thickness of the Au electrode and the acoustic velocity V of the individual wave modes with lithium niobate having Euler angles of (0°, 105°, 0°).
Figure 14:
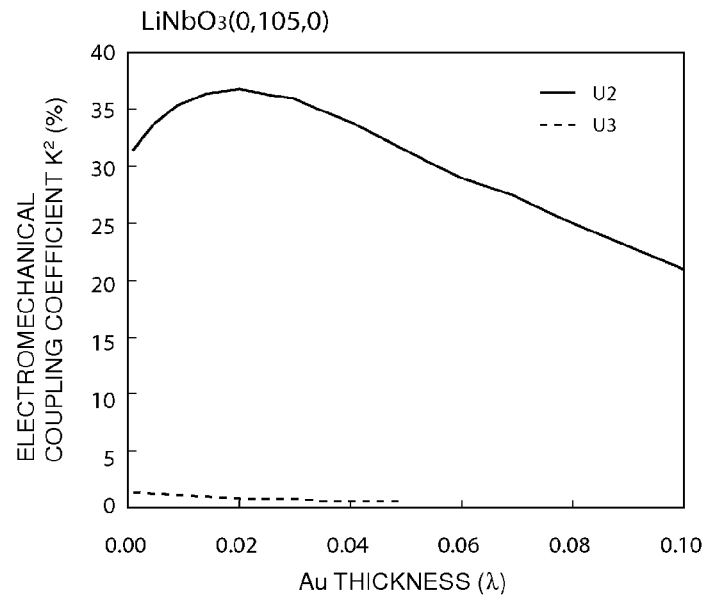
FIG. 14 is a diagram that illustrates the relationship between the thickness of the Au electrode and the electromechanical coupling coefficient $k^2$ of the individual wave modes with lithium niobate having Euler angles of (0°, 105°, 0°).

FIG. 13 and FIG. 14 are diagrams that illustrate the relationship between the thickness of the IDT electrode made of Au and the velocity and electromechanical coupling coefficient, respectively, of the SH surface acoustic wave as measured using lithium niobate having Euler angles of (0°, 105°, 0°).

Figure 15:
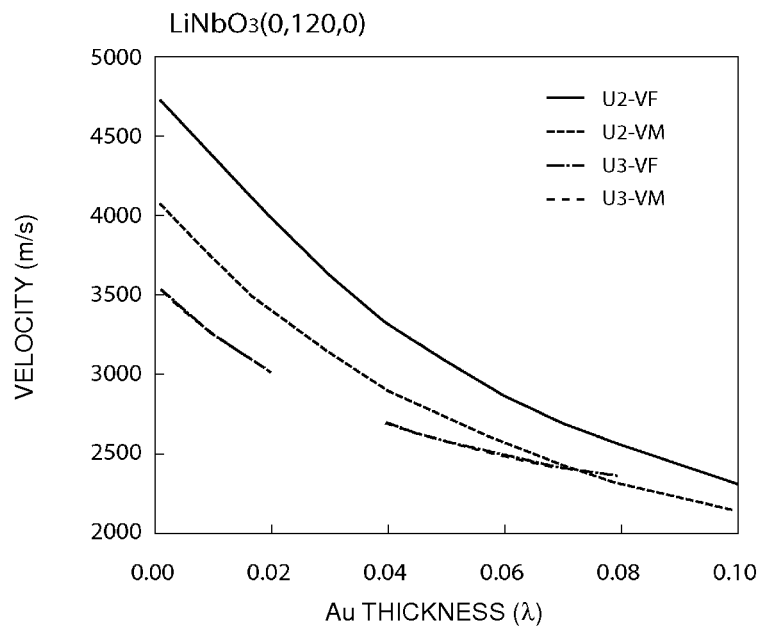
FIG. 15 is a diagram that illustrates the relationship between the thickness of the Au electrode and the acoustic velocity V of the individual wave modes with lithium niobate having Euler angles of (0°, 120°, 0°).
Figure 16:
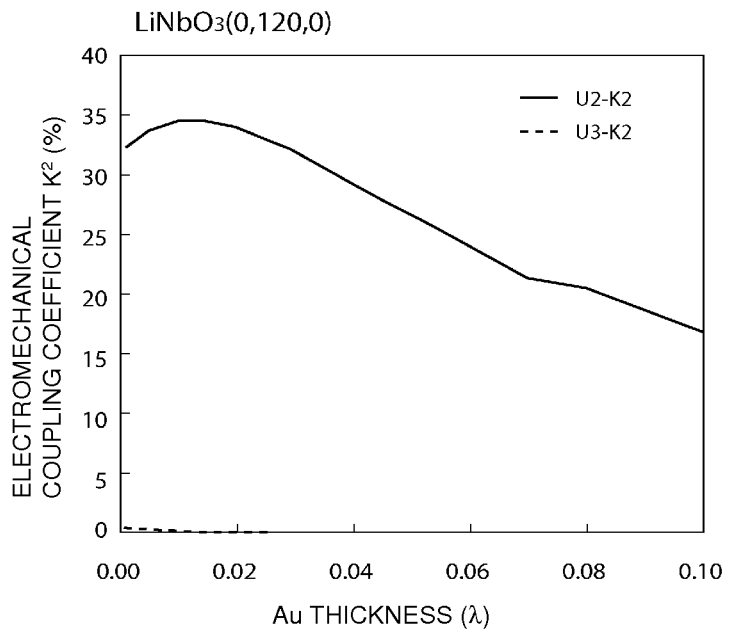
FIG. 16 is a diagram that illustrates the relationship between the thickness of the Au electrode and the electromechanical coupling coefficient $k^2$ of the individual wave modes with lithium niobate having Euler angles of (0°, 120°, 0°).

Likewise, FIG. 15 and FIG. 16 are diagrams that illustrate the relationship between the thickness of the IDT electrode made of Au and the velocity and electromechanical coupling coefficient, respectively, of the SH surface acoustic wave as measured using lithium niobate having Euler angles of (0°, 120°, 0°).

As FIG. 12 shows, the electromechanical coupling coefficient $k^2$ is as high as about 3% to about 4% when the Euler angle θ is 90°, for example. When the Euler angle θ is 105°, however, the spurious response of the Rayleigh wave can be as small as about 1.5% or less. When θ is 120°, as is clear from FIG. 16, the spurious response of the Rayleigh wave can be very small.

Furthermore, as is clear from FIG. 14 and FIG. 16, the electromechanical coupling coefficient $k^2$ can be high when the thickness of the IDT electrode made of Au is in the range of about 0.01λ to about 0.03λ.

It is thus desirable that for an IDT electrode made of Au, its thickness be in the range of about 0.01λ to about 0.03λ, for example.

Even if the IDT electrode is changed from Al to Au, therefore, an elastic wave device insusceptible to spurious responses can be built in accordance with the present invention as in Preferred Embodiment 1.

Figure 17:
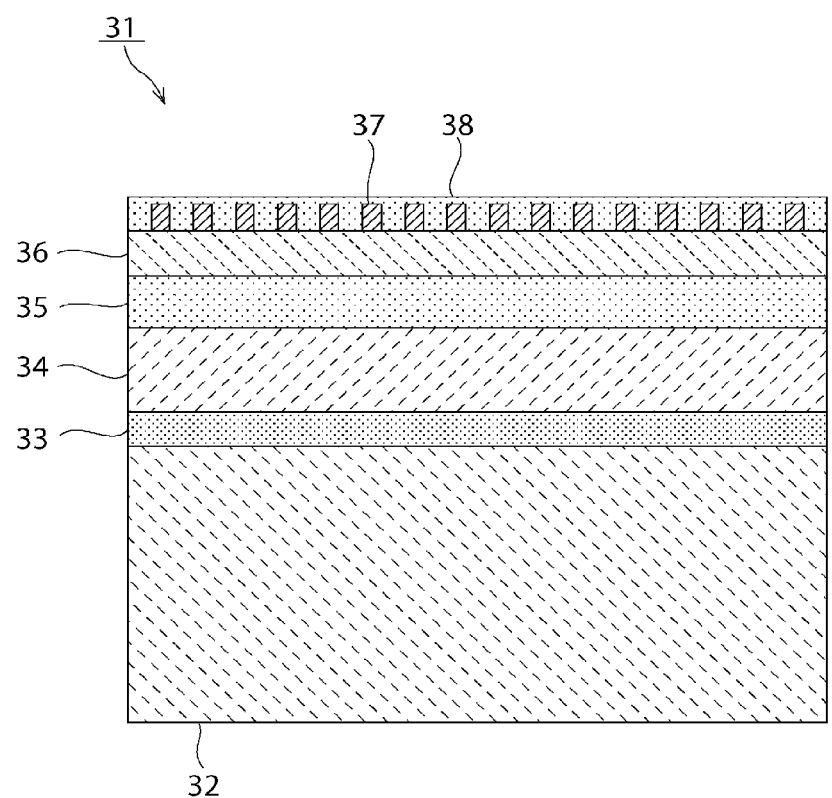
FIG. 17 is an elevational cross-sectional view of an elastic wave device according to Preferred Embodiment 3 of the present invention.

A one-port surface acoustic wave resonator 31 illustrated by a schematic elevational cross-sectional view in FIG. 17 was prepared as Example 1. A supporting substrate 32 was provided having a thickness of 350 μm and made from a 30° Y-cut lithium niobate substrate. A 0.3-μm-thick silicon oxide film 33 was formed on this supporting substrate 32. Then a 1.6-μm-thick aluminum nitride film 34 as a high-acoustic-velocity film, a 0.4-μm-thick silicon oxide film 35 as a low-acoustic-velocity film, and a 0.4-μm-thick and 30° Y-cut lithium niobate film 36, which therefore had Euler angles of (0°, 120°, 0°), were stacked in this order. An IDT electrode 37 was formed on the lithium niobate film 36.

Then a silicon oxide film 38 was formed to cover the IDT electrode 37. The silicon oxide film 38 defines and functions as a temperature-characteristic-improving film to reduce the absolute temperature coefficient of resonant frequency TCF.

As for the structure of the IDT electrode 37, it was shaped as a component a one-port surface acoustic wave resonator like that illustrated in FIG. 1B. To form the IDT electrode 37 and reflectors, i.e., the electrode, a 200-nm-thick Al-based alloy film was stacked on a 10-μm-thick Ti film. The Al-based alloy used was an Al-based alloy containing 1% by weight Cu. The Ti film was formed with the aim to improve the adhesion to the lithium niobate film 36.

The electrode design parameters of this one-port surface acoustic wave resonator 31 were as follows.
Period λ of the IDT electrode: 2 μm
Period of the electrode fingers of the reflectors: 2 μm The number of pairs of fingers of the IDT electrode: 94 pairs
The number of electrode fingers of the reflectors: 21 fingers each
Metallization ratio: 0.5
Overlap width: 20λ

The IDT electrode 37 was of the normal type. The arrangement was such that the distance between the IDT electrode and the reflectors should be the period λ.

Figure 18:
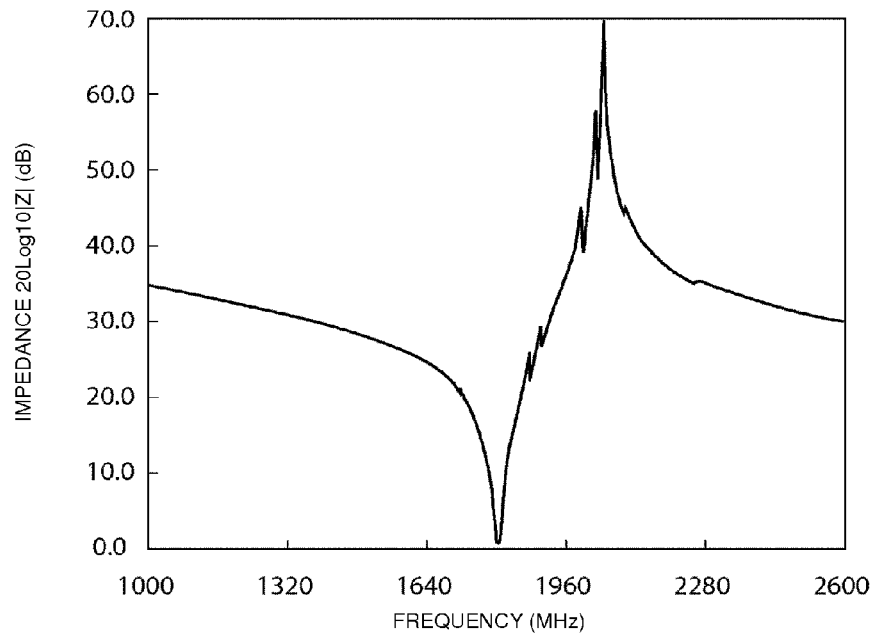
FIG. 18 is a diagram that illustrates impedance-frequency characteristics with an AlCu electrode as the IDT electrode in Preferred Embodiment 3 of the present invention.

FIG. 18 is a diagram that illustrates the impedance-frequency characteristics of the surface acoustic wave resonator of Example 1 formed in this way.

Figure 19:
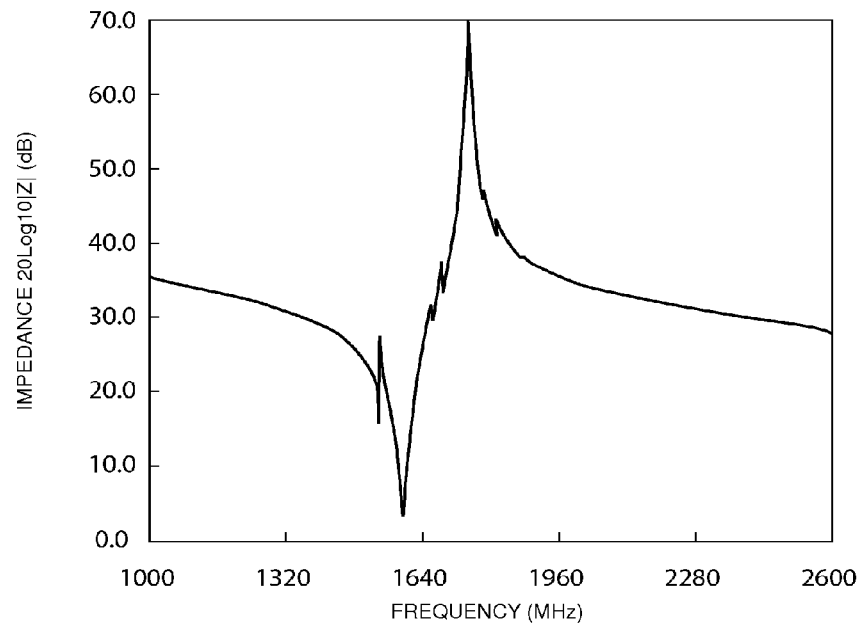
FIG. 19 is a diagram that illustrates impedance-frequency characteristics with a Pt electrode as the IDT electrode in Preferred Embodiment 3 of the present invention.

A surface acoustic wave resonator of Example 2 was prepared in the way described above, in the same way as the one-port surface acoustic wave resonator 31 of Example 1 above, except that a multilayer structure described as Al/Ti/Pt/Ti=180 nm/20 nm/30 nm/10 nm, from top to bottom, was used as the IDT electrode and the electrodes of the reflectors. FIG. 19 illustrates the impedance-frequency characteristics of the surface acoustic wave resonator of Example 2.

Figure 20:
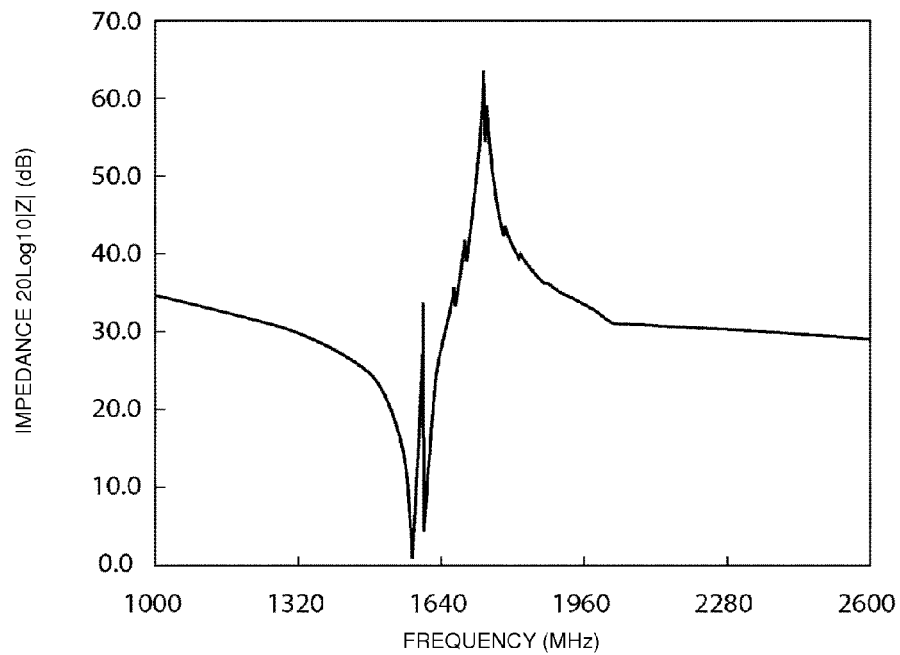
FIG. 20 is a diagram that illustrates the impedance-frequency characteristics of an elastic wave device according to a comparative example.

For comparison purposes, a surface acoustic wave resonator was provided that was formed in the same way as in Example 1 above except that its structure was not one in which a high-acoustic-velocity film and a low-acoustic-velocity film were stacked between a supporting substrate and a lithium niobate film and that an IDT electrode and reflectors made of an Al-based alloy and described as Al/Ti=200 nm/20 nm were formed on a lithium niobate substrate having Euler angles of (0°, 120°, 0°). FIG. 20 illustrates the impedance-frequency characteristics of this surface acoustic wave resonator.

The impedance at the anti-resonant frequency of the surface acoustic wave resonator of a comparative example illustrated in FIG. 20 is about 63.8 dB, whereas that of Example 1 above is higher, about 69.9 dB. This seems to be because the propagation loss of the SH surface acoustic wave is small at the anti-resonant frequency, which is a high frequency. In Example 2, the impedance at the anti-resonant frequency is similarly high, about 69.9 dB, indicating that the propagation loss of the SH surface acoustic wave is small.

Stacking a high-acoustic-velocity film and a low-acoustic-velocity film between a supporting substrate and a lithium niobate film and ensuring that an Euler angle is in the particular range defined above therefore effectively reduces the propagation loss of the SH surface acoustic wave, as the comparison of Example 1, Example 2, and this comparative example also indicates.

Figure 21:
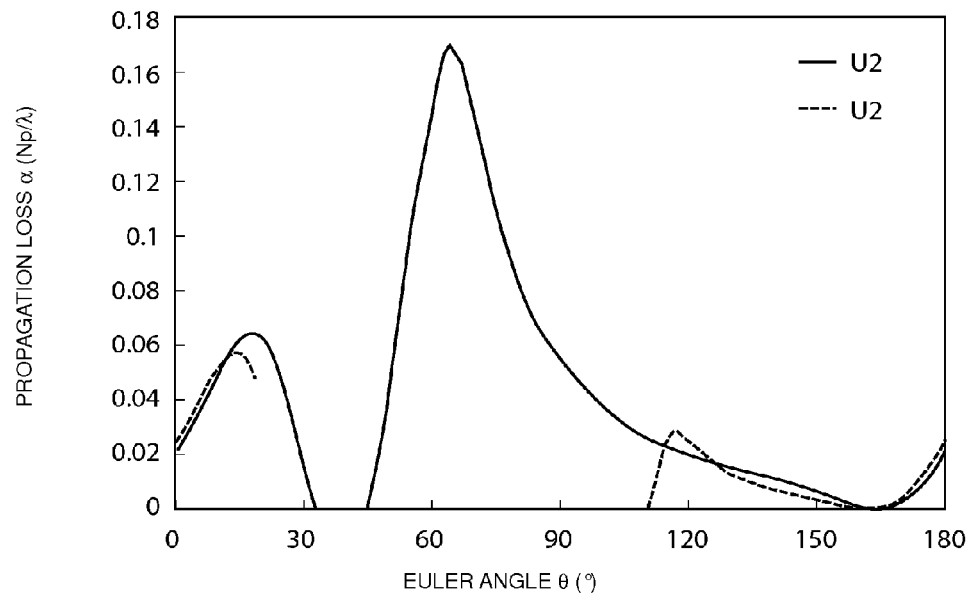
FIG. 21 is a diagram that illustrates the relationship between the Euler angle θ and the propagation loss α of an elastic wave device according to a comparative example on the anti-resonant frequency side and the resonant frequency side.

FIG. 21 illustrates the propagation loss of the surface acoustic wave device of the above comparative example at the resonant frequency and the anti-resonant frequency with different Euler angles θ. As is clear from FIG. 21, the propagation loss at the anti-resonant frequency, indicated by a solid line, is very large over a wide range of Euler angles θ.

In conclusion, this preferred embodiment described above has a structure in which a low-acoustic-velocity film is disposed between a lithium niobate film as a piezoelectric member and a high-acoustic-velocity film. This helps the vibration energy of the surface acoustic wave to concentrate on the piezoelectric member side and thus allows the electromechanical coupling coefficient to be increased. The structure used in this preferred embodiment also allows for the use of Al or any other light metal to be used to form the IDT electrode, as compared with a structure in which the IDT electrode is made of a heavy metal so that energy should concentrate on the surface. Furthermore, the propagation loss of the surface acoustic wave that occurs due to scattering on the small irregularities on the fingers of the IDT electrode is significantly reduced because the low-acoustic-velocity film is flat.

An elastic wave device according to Preferred Embodiment 1 preferably includes, as described above, a high-acoustic-velocity film 3, a low-acoustic-velocity film 4, a lithium niobate film 5, and an IDT electrode 6 on a supporting substrate 2. The method for producing such an elastic wave device is not particularly limited. However, an elastic wave device 1 having a thin lithium niobate film can be easily obtained through the use of an ion-implantation-based production method described below.

A non-limiting example of a preferred embodiment of this production method is described with reference to FIGS. 22A-22E and FIGS. 23A-23C.

Figure 22A:
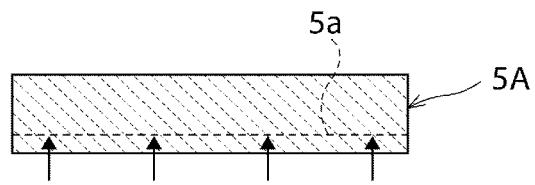
FIG. 22A to FIG. 22E are elevational cross-sectional views for describing a method for producing an elastic wave device according to Preferred Embodiment 1 of the present invention.

First, a lithium niobate substrate 5A is provided as illustrated in FIG. 22A. Hydrogen ions are implanted in either side of the lithium niobate substrate 5A. The kind of the ion implanted is not limited to hydrogen. Helium or any other ion may also be used.

The ion implantation energy is not particularly limited. In this preferred embodiment, it preferably is about 107 KeV, and the dose level preferably is about $8 \times 10^{16}$ atoms/cm$^2$, for example.

After ion implantation, an ion dose distribution occurs in the lithium niobate substrate 5A in the thickness direction. The portion where the ion has the highest concentration is indicated by a broken line in FIG. 22A. At the implanted-ion-rich portion 5a, the portion where the ion has the highest concentration, indicated by a broken line, the substrate easily separates in response to stress when heated as described below. Japanese Unexamined Patent Application Publication No. 2002-534886 discloses a method for separating a substrate at such an implanted-ion-rich portion 5a.

In this step, a lithium niobate film 5 is obtained through the separation of the lithium niobate substrate 5A at this implanted-ion-rich portion 5a. The lithium niobate film 5 is a layer that extends between the implanted-ion-rich portion 5a and the surface of the lithium niobate substrate 5A where the ion implantation was started. The lithium niobate film 5 may be subjected to polishing or any other treatment. Thus, the distance between this implanted-ion-rich portion 5a and the surface of the lithium niobate substrate 5A where the ion is implanted is enough if it is equal to the thickness of the resulting lithium niobate film or slightly larger than this thickness.

Figure 22B:
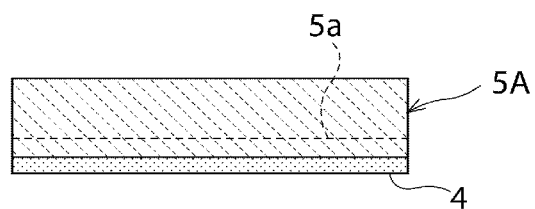

Then a low-acoustic-velocity film 4 is formed on the side of the lithium niobate substrate 5A where the ion is implanted, as illustrated in FIG. 22B. It is also possible to bond a low-acoustic-velocity film formed beforehand to the lithium niobate substrate 5A by transfer or any other technique.

Figure 22C:
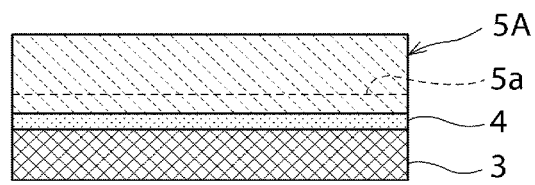

Then a high-acoustic-velocity film 3 is formed on the side of the low-acoustic-velocity film 4 opposite the lithium niobate substrate 5A as illustrated in FIG. 22C. The high-acoustic-velocity film 3 can also be prepared without film formation. It is possible to bond a high-acoustic-velocity film to the low-acoustic-velocity film 4 by transfer or any other technique.

Figure 22D:
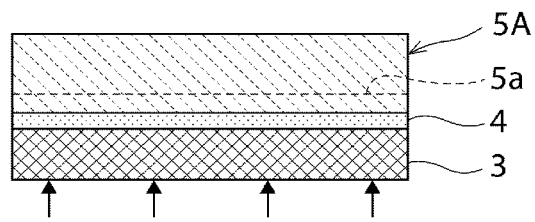

Then the exposed surface of the high-acoustic-velocity film 3, i.e., the side opposite the low-acoustic-velocity film 4, is mirror-finished as illustrated in FIG. 22D. The strength of the joint between the supporting substrate described below and the high-acoustic-velocity film can be enhanced through mirror-finishing.

Figure 22E:
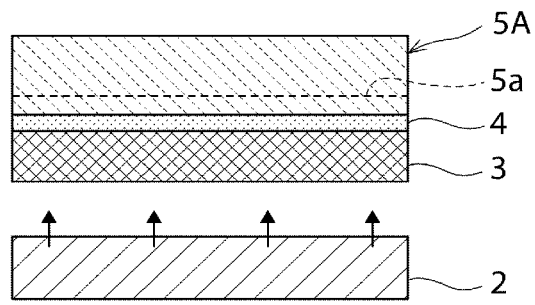

Then a supporting substrate 2 is joined to the high-acoustic-velocity film 3 as illustrated in FIG. 22E.

The low-acoustic-velocity film 4 is a silicon oxide film in accordance with Preferred Embodiment 1 above. The high-acoustic-velocity film 3 is an aluminum nitride film.

Figure 23A:
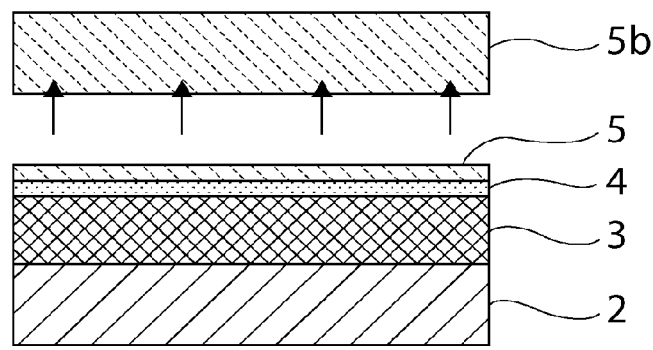
FIG. 23A to FIG. 23C are elevational cross-sectional views for describing a method for producing an elastic wave device according to Preferred Embodiment 1 of the present invention.

Then after heating, the lithium niobate substrate portion 5b of the lithium niobate substrate 5A, extending above the implanted-ion-rich portion 5a, is isolated as illustrated in FIG. 23A. As mentioned above, applying stress via the implanted-ion-rich portion 5a through heating helps the lithium niobate substrate 5A to separate. The heating temperature in this case is enough if it is approximately in the range of 250° C. to 400° C., for example.

Figure 23B:
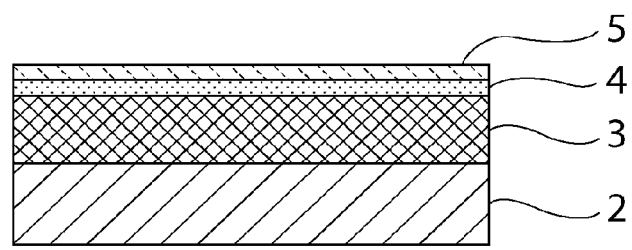

In this preferred embodiment, a 500-nm-thick lithium niobate film 5 is obtained through this thermal separation process. A structure is thus obtained in which a lithium niobate film 5 is stacked on a low-acoustic-velocity film 4 as illustrated in FIG. 23B. Then a heating process is performed to recover piezoelectricity in which the device is maintained at a temperature of approximately 400° C. to 500° C. for about 3 hours, for example. If necessary, the top of the separated lithium niobate film 5 may be polished before this heating process.

Figure 23C:
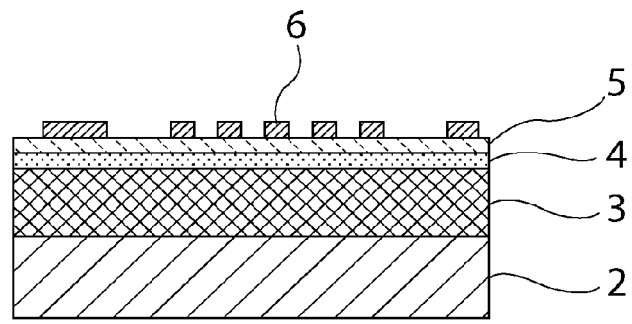

Then an electrode including an IDT electrode 6 is formed as illustrated in FIG. 23C. The method for forming the electrode is not particularly limited. The formation of the electrode can be performed using any appropriate method such as vapor deposition, plating, or sputtering, for example.

A production method according to this preferred embodiment allows a lithium niobate film 5 having inclined Euler angles to be formed easily and with uniform thickness through the separation process described above.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device configured to use an SH surface acoustic wave comprising:
    a lithium niobate film;
    a supporting substrate;
    a high-acoustic-velocity film located on the supporting substrate and configured so that an acoustic velocity of a propagating bulk wave is higher than an acoustic velocity of an elastic wave that propagates on the lithium niobate film;
    a low-acoustic-velocity film stacked on the high-acoustic-velocity film and configured so that an acoustic velocity of a propagating bulk wave is lower than an acoustic velocity of a bulk wave that propagates in the lithium niobate film, the lithium niobate film being stacked on the low-acoustic-velocity film; and
    an IDT electrode located on either side of the lithium niobate film; wherein
    when the lithium niobate film has Euler angles of (0°±5°, θ,0°), the Euler angle θ is in a range of about 0° to about 8° and about 57° to about 180°; and
    the high-acoustic-velocity film has a thickness of about 0.3λ to about 1λ, where λ is a wavelength of a fundamental mode of the SH surface acoustic wave.

2. The elastic wave device according to claim 1, wherein the Euler angle θ of the lithium niobate film is in a range of about 83° to about 145°.

3. The elastic wave device according to claim 1, wherein the Euler angle θ of the lithium niobate film is in a range of about 100° to about 160°.

4. The elastic wave device according to claim 1, wherein the low-acoustic-velocity film is made of silicon oxide.

5. The elastic wave device according to claim 4, wherein (x, y) in xy coordinates is in an area defined by connecting points (0.023λ, 0.3λ), (0.05λ, 0.20λ), (0.10λ, 0.14λ), (0.20λ, 0.125λ), (0.44λ, 0.14λ), (0.47λ, 0.20λ), (0.435λ, 0.25λ), (0.3λ, 0.36λ), (0.15λ, 0.42λ), (0.08λ, 0.42λ), (0.05λ, 0.40λ), and (0.23λ, 0.3λ) in this order where x is a film thickness of the silicon oxide, y is a thickness of the lithium niobate film, and λ is a wavelength of a fundamental mode of the SH surface acoustic wave.

6. The elastic wave device according to claim 1, wherein the high-acoustic-velocity film is a film made of a material selected from the group consisting of aluminum nitride, silicon nitride, and aluminum oxide or a multilayer film made of at least two of aluminum nitride, silicon nitride, and aluminum oxide.

7. The elastic wave device according to claim 1, wherein the IDT electrode is made of Au, and the IDT electrode made of Au has a thickness of about 0.01λ to about 0.03λ, where λ is a wavelength of the fundamental mode of the SH surface acoustic wave.

8. The elastic wave device according to claim 1, wherein the supporting substrate has a coefficient of linear expansion smaller than a coefficient of linear expansion of the lithium niobate film.

9. The elastic wave device according to claim 1, wherein the low-acoustic-velocity film has a specific acoustic impedance smaller than a specific acoustic impedance of the lithium niobate film.

* * * * *